(12) United States Patent
Mukaiyama et al.

(10) Patent No.: US 7,365,618 B2
(45) Date of Patent: Apr. 29, 2008

(54) HIGH-FREQUENCY CIRCUIT DEVICE, HIGH-FREQUENCY MODULE, AND COMMUNICATION APPARATUS

(75) Inventors: Kazutaka Mukaiyama, Sagamihara (JP); Seiji Hidaka, Yokohama (JP); Koichi Takizawa, Hachioji (JP); Koichi Sakamoto, Otsu (JP)

(73) Assignee: Murata Manufacturing Co., Ltd. (JP)

( * ) Notice: Subject to any disclaimer, the term of this patent is extended or adjusted under 35 U.S.C. 154(b) by 0 days.

(21) Appl. No.: 11/830,976

(22) Filed: Jul. 31, 2007

(65) Prior Publication Data

US 2007/0285190 A1    Dec. 13, 2007

Related U.S. Application Data

(63) Continuation-in-part of application No. PCT/JP05/22338, filed on Dec. 6, 2005.

(51) Int. Cl.
*H01P 1/18*    (2006.01)
(52) U.S. Cl. ................. 333/156; 333/161; 333/245
(58) Field of Classification Search ............. 333/156, 333/157, 161, 245
See application file for complete search history.

(56) References Cited

U.S. PATENT DOCUMENTS 3,760,304 A * 9/1973 Cohn .................. 333/209
4,636,757 A * 1/1987 Harrison et al. ........ 333/218
5,115,217 A * 5/1992 McGrath et al. ........ 333/246

FOREIGN PATENT DOCUMENTS

| JP | 63-3205 | 1/1988 |
| JP | 8-265007 | 10/1996 |
| JP | 10-242717 | 9/1998 |
| JP | 10-335909 | 12/1998 |
| JP | 2004-007349 | 1/2004 |

OTHER PUBLICATIONS

International Search Report, PCT/JP2005/022338, Mar. 10, 2005.
Written Opinion, PCT/JP2005/022338, Mar. 10, 2005.
Ota et al., "Analysis of Spatial Network Method of Rectangular Bent Portion of a Coplanar Line", 1994 Institute of Electronics, Information and Communication Engineers Autumn Convention-Society Previous Convention-Lecture Collected Works, Electronics 1, Institute of Electronics, Information and Communication Engineers, Sep. 5, 1994, p. 98. (cited in International Search Report).

(Continued)

*Primary Examiner*—Stephen E. Jones
(74) *Attorney, Agent, or Firm*—Dickstein, Shapiro, LLP.

(57) ABSTRACT

A high-frequency circuit device, a high-frequency module, and a communication apparatus, which prevent generation of an undesired wave to prevent electrical power loss and undesired coupling, are provided. The high-frequency circuit device includes a first slot line and a second slot line, which are provided at respective surfaces of a dielectric substrate, are formed with the same shape. An FET is provided on the first slot line. For preventing the mounting of the FET from causing a phase difference to occur between a high-frequency signal, which propagates along the first slot line, and a high-frequency signal, which propagates along the second slot line, a phase-adjusting stub is formed at a position of a stub at the second slot line. The phase is adjusted by changing the length of the stub.

11 Claims, 11 Drawing Sheets

OTHER PUBLICATIONS

Sakamoto et al., "Proposal of Millimeter-wave FR Module Making Use of Distinctive Characteristic of High Dielectric Substrate", Institute of Electronics, Information and Communication Engineers General Convention Lecture Collected Works, Electronic 1, Institute of Electronics, Information and Communication Engineers, Mar. 3, 2003, pp. S-31-S-32.(cited International Search Report).

* cited by examiner

ELECTRODE LINE (a)

(b)

HIGH-FREQUENCY CIRCUIT DEVICE, HIGH-FREQUENCY MODULE, AND COMMUNICATION APPARATUS

CROSS REFERENCE TO RELATED APPLICATIONS

The present application is a continuation of International Application No. PCT/JP2005/022338, filed Dec. 6, 2005, which claims priority to Japanese Patent Application No. JP2005-067685, filed Mar. 10, 2005, the entire contents of each of these applications being incorporated herein by reference in their entirety.

FIELD OF THE INVENTION

The present invention relates to a high-frequency circuit device, a high-frequency module, and a communication apparatus, which use a slot line that transmits a high-frequency signal, such as a microwave signal or a millimeter-wave signal.

BACKGROUND OF THE INVENTION

A slot line is greatly used in a high-frequency circuit device because, for example, the slot line facilitates connection of an electrical element, such as a semiconductor element, or makes it easier to increase characteristic impedance. In particular, in recent years, from the viewpoint of reducing transmission loss, lines of a both-side slot structure type in which slot lines are symmetrically formed on respective front and back surfaces of a dielectric substrate (such a type is called PDTL (Planer Dielectric Transmission Line)) are being used in a high-frequency circuit device (refer to, for example, Patent Documents 1 and 2).

Patent Document 1: Japanese Unexamined Patent Application Publication No. 08-265007

Patent Document 2: Japanese Unexamined Patent Application Publication No. 2004-007349

However, the related high-frequency circuit device using lines of the aforementioned PDTL type has the following problems.

FIG. 22 is a schematic sectional view for illustrating the problems of the related high-frequency circuit device.

As shown in FIG. 22(a), for lines of the PDTL type, slot lines 111 and 112 having substantially the same shape are formed in respective surfaces of a dielectric substrate 100, and the same high-frequency signals are transmitted to the respective slot lines 111 and 112.

Therefore, when a phase difference does not occur between the high-frequency signal that propagates along the slot line 111 and the high-frequency signal that propagates along the slot line 112, since, as shown in FIG. 22(a), electrical fields E1 and E2 that are generated by both high-frequency signals face the same direction, a potential difference does not occur between the upper and lower sides of the dielectric substrate 100. That is, in such a case, an undesired wave is not generated in the dielectric substrate 100, so that unnecessary electrical power loss and undesired coupling with a peripheral device do not occur.

However, in the high-frequency circuit device, as shown in FIG. 22(b), since an electrical element 110, such as an FET, is mounted to the slot line 111, the symmetry between the slot lines 111 and 112 is destroyed. Therefore, a phase difference occurs between the high-frequency signal that propagates along the slot line 111 and the high-frequency signal that propagates along the slot line 112. As a result, as shown in FIG. 22(b), the electrical fields E1 and E2 that are generated by both high-frequency signals face opposite directions, thereby causing a potential difference to occur between the upper and lower sides of the dielectric substrate 100. That is, in such a case, undesired electrical fields E are generated in the dielectric substrate 100, causing unnecessary electrical power loss to occur or undesired coupling to occur between an undesired wave, caused by the electrical fields E, and a peripheral device, as a result of which operating characteristics of the peripheral device may become deteriorated.

SUMMARY OF THE INVENTION

The present invention is achieved to overcome the aforementioned problems, and has as its object the provision of a high-frequency circuit device, a high-frequency module, and a communication apparatus, which prevent generation of an undesired wave to prevent electrical power loss and undesired coupling.

To overcome the aforementioned problems, there is provided a high-frequency circuit device comprising a first slot line which is a space line provided between facing electrodes disposed on a front surface of a substrate, a second slot line which is a space line provided between facing electrodes disposed on a back surface of the substrate, the second slot line opposing the first slot line, and an electrical element that is provided on the first slot line. A phase adjuster is provided at the second slot line, and adjusts a phase of a high-frequency signal that propagates along the second slot line to a phase that is substantially the same as a phase of a high-frequency signal that propagates along the first slot line.

By virtue of such a structure, it is possible to propagate the same high-frequency signals along the first slot line and the second slot line. In addition, the high-frequency signal that propagates along the first slot line is predeterminately processed by the electrical element that is provided on the first slot line. When the electrical element is provided on the first slot line, a potential difference may occur between the high-frequency signal that propagates along the first slot line and the high-frequency signal that propagates along the second slot line. In such a case, using a phase adjuster, provided at the second slot line, the phase of the high-frequency signal that propagates along the second slot line can be adjusted to a phase that is substantially the same as the phase of the high-frequency signal that propagates along the first slot line. This can suppress the undesired wave that is generated in the substrate by the phase difference.

In the high-frequency circuit device according to the present invention, the phase adjuster may be a stub that is branched from the second slot line.

By virtue of such a structure, adjusting the length or shape of the stub that is branched from the second slot line makes it possible to adjust the phase of the high-frequency signal that propagates along the second slot line to a phase that is substantially the same as the phase of the high-frequency signal that propagates along the first slot line.

In the high-frequency circuit device according to the present invention, the stub may be a straight short stub having a predetermined length.

In the high-frequency circuit device according to the present invention, the phase adjuster may be an electrode line having a predetermined length and connecting the electrodes so as to be positioned on both sides of the second slot line.

By virtue of such a structure, adjusting the length of the electrode line makes it possible to adjust the phase of the high-frequency signal that propagates along the second slot line to a phase that is substantially the same as the phase of the high-frequency signal that propagates along the first slot line.

In the high-frequency circuit device according to the present invention, the phase adjuster is provided at a portion of the second slot line so as to be situated substantially directly behind a location where the electrical element is provided.

The high-frequency circuit device of the present invention may be used in a high-frequency module, a communication apparatus, or a radar apparatus.

According to the high-frequency circuit devices according to the present invention, the phase of the high-frequency signal that propagates along the second slot line can be adjusted by the phase adjuster to a phase that is substantially the same as the phase of the high-frequency signal that propagates along the first slot line, so that it is possible to suppress undesired wave that is generated in the substrate. Therefore, it is possible to prevent undesired wave from being generated to reduce electrical power loss, and to prevent undesired coupling with a peripheral external device that occurs when the undesired wave leaks to the outside of the substrate. As a result, it is possible to improve the characteristics and designability of the high-frequency circuit devices, themselves, and to reduce variations in characteristics.

In particular, adjusting the length or shape of the stub makes it possible to adjust the phase of the high-frequency signal that propagates along the second slot line to a phase that is substantially the same as the phase of the high-frequency signal that propagates along the first slot line. Therefore, not only is it possible to suppress the generation of an undesired wave, but also it is possible to increase the designability in terms of transmission characteristics of the second slot line.

The phase of the high-frequency signal that propagates along the second slot line can be adjusted by the electrode line, formed on both sides of the second slot line, without using the stub that requires a large disposition space. Therefore, it is possible to reduce the size of the high-frequency circuit device, itself. In addition, since isolation at the second-slot-line side is increased, the characteristics and designability of the device can be improved.

According to the present invention, it is possible to improve the operating characteristics of the high-frequency module and the communication apparatus, and to reduce variations in characteristics. In addition, it is possible to improve the designability of the high-frequency module and the communication apparatus.

Figure 1:
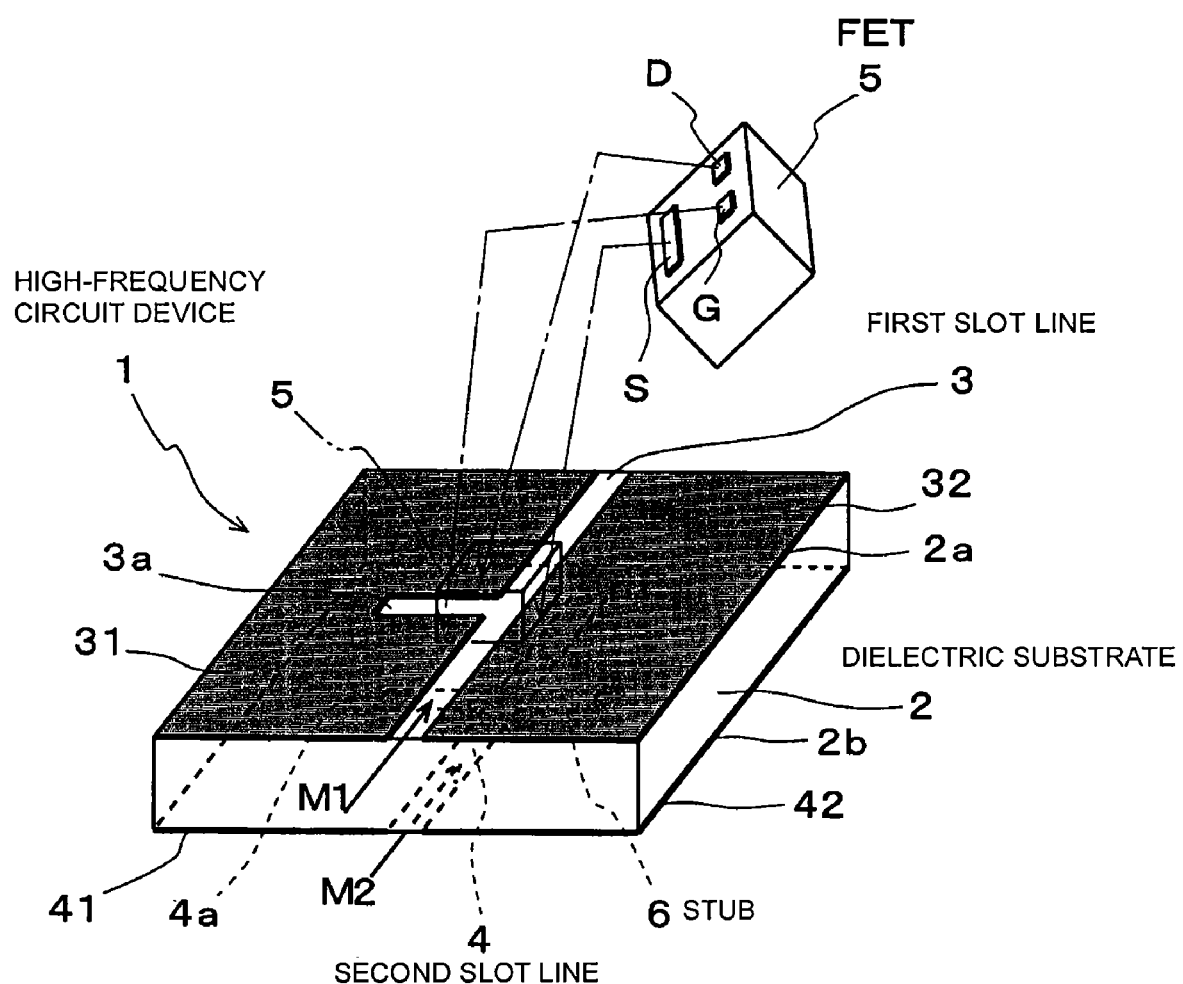
FIG. 1 is a perspective view of a high-frequency circuit device according to a first embodiment of the invention.

REFERENCE NUMERALS 1 high-frequency circuit device
2 dielectric substrate
3 first slot line
3a, 4a isolation stubs
4 second slot line
5 FET
6, 61, 62 phase-adjusting stubs
7 high-frequency oscillating circuit
8 high-frequency module
9 BB chip
31, 32, 41, 42 electrodes
32a DC electrode
63 electrode line
70 dielectric resonator
71, 72 DC cut lines
81 to 85 split substrates
81A antenna circuit
82A common device circuit
83A transmitting circuit
84A receiving circuit
85A oscillating circuit
86 package
87 cover
88 parasitic antenna
89 blocking plate D drain electrode
G gate electrode
M1, M2 high-frequency signals
source electrode

BRIEF DESCRIPTION OF THE INVENTION

The best mode for carrying out the invention will hereafter be described with reference to the drawings.

First Embodiment

Figure 2:
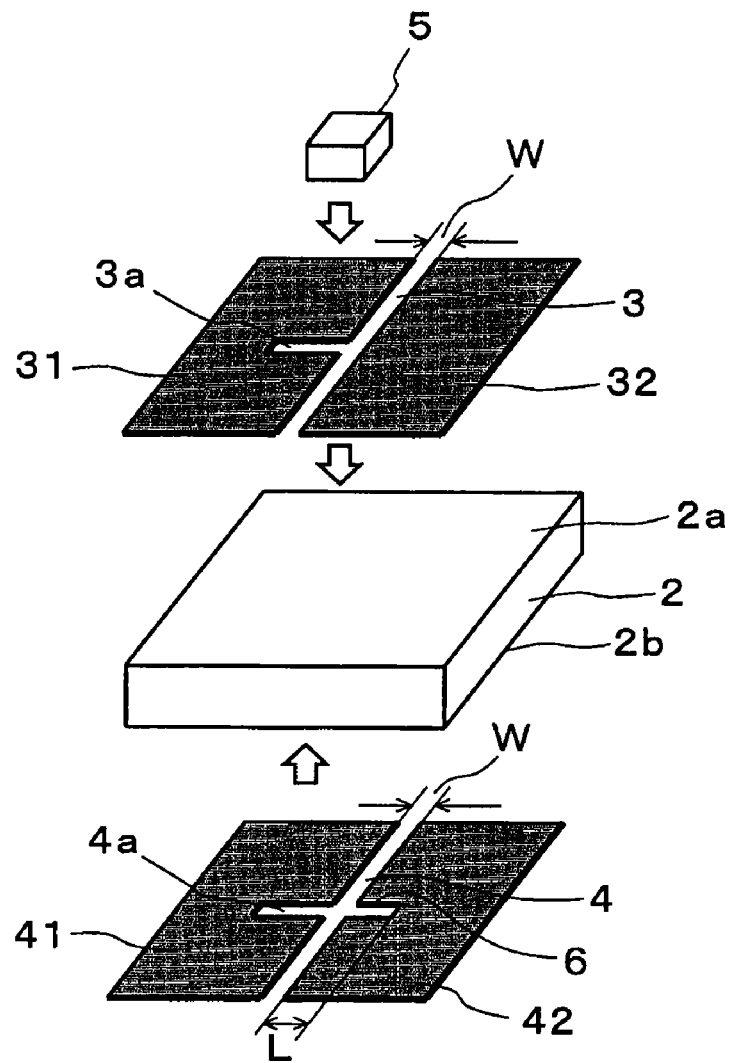
FIG. 2 is an exploded perspective view of the high-frequency circuit device shown in FIG. 1.
Figure 3:
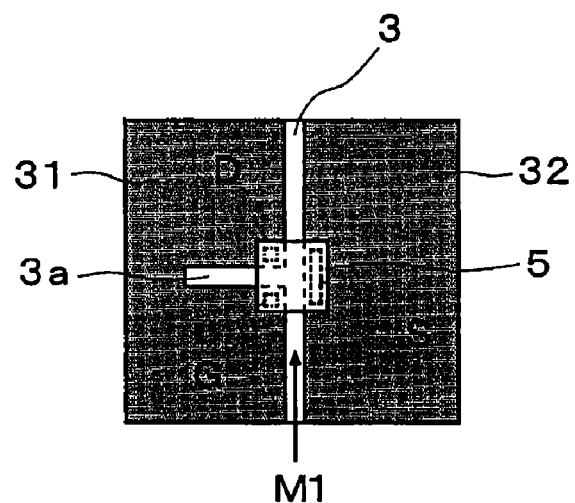
FIG. 3 is a plan view of a front surface side of the high-frequency circuit device.
Figure 4:
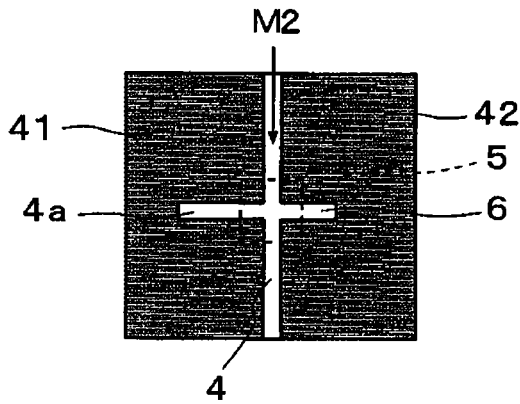
FIG. 4 is a plan view of a back surface side of the high-frequency circuit device.

FIG. 1 is a perspective view of a high-frequency circuit device according to a first embodiment of the invention. FIG. 2 is an exploded perspective view of the high-frequency circuit device shown in FIG. 1. FIG. 3 is a plan view of a front surface side of the high-frequency circuit device. FIG. 4 is a plan view of a back surface side of the high-frequency circuit device.

As shown in FIG. 1, a high-frequency circuit device 1 according to this embodiment is an amplifying circuit device, and has a first slot line 3 and a second slot line 4, which are provided in respective surfaces of a dielectric substrate 2, and a field-effect transistor element (hereunder referred to as "FET") 5, serving as an electrical element.

The first slot line 3 is a space line between a pair of electrodes 31 and 32 disposed on a surface 2a of the dielectric substrate 2 so as to face each other. More specifically, as shown in FIG. 2, forming the electrodes 31 and 32 on the dielectric substrate 2 so as to be separated by an interval W1 provides the first slot line 3 having a width W1. A stub 3a is provided as a recess in the electrode 31 and where the FET 5, described later, is mounted. The stub 3a is an isolation stub, and its length is set to ¼ the wavelength of a high-frequency signal M1 that propagates along the first slot line 3.

The second slot line 4 is a space line between a pair of electrodes 41 and 42 disposed on a back surface 2b of the dielectric substrate 2 so as to face each other. The second slot line 4 opposes the first slot line 3. That is, the electrodes 41 and 42 are formed at the bottom of the dielectric substrate 2 so as to be separated by an interval W2, and a stub 4a having the same length and shape as the isolation stub 3a of the first slot line 3 is formed at a portion opposing the stub 3a.

The FET 5 is an element that functions as an active element, such as an amplifying element, and, as shown in FIG. 1, is provided on the first slot line 3. More specifically, the FET 5 has a drain electrode D, a gate electrode G, and a source electrode S at its back surface, and is mounted in such a way that the source electrode S is connected to the electrode 32, and the drain electrode D and the gate electrode G are connected to the electrode 31 so as to be disposed on respective sides of the isolation stub 3a.

Accordingly, since the FET 5 is provided on the first slot line 3, a phase difference may occur between the high-frequency signal M1 that propagates along the first slot line 3 and a high-frequency signal M2 that propagates along the second slot line 4. Therefore, in the embodiment, a stub 6 is provided as a phase adjuster at the second slot line 4. By this, the phase of the high-frequency signal M2 that propagates along the second slot line 4 is adjusted so as to become substantially the same as the phase of the high-frequency signal M1 that propagates along the first slot line 3.

More specifically, as shown in FIG. 2, the stub 6 is a straight short stub having a length L, and is branched from the stub 4a of the second slot line 4 in a direction opposite to the stub 4a. By this, since the stub 6 is positioned substantially directly behind the FET 5, the phase of the high-frequency signal M2 that propagates along the second slot line 4 can be adjusted by changing the length L of the stub 6.

Next, operations and advantages of the high-frequency circuit device according to this embodiment will be described.

As shown in FIGS. 1, 3, and 4, when the same high-frequency signals M1 and M2 propagate along the respective first slot line 3 and second slot line 4 of the high-frequency circuit device 1, the high-frequency signal M1 that propagates along the first slot line 3 is amplified by the FET 5 provided on the first slot line 3, and the amplified signal M1 is output. At this time, since the FET 5 is provided on the first slot line 3, the phase of the high-frequency signal M1 that propagates along the first slot line 3 may differ from the phase of the high-frequency signal M2 that propagates along the second slot line 4. However, in the embodiment, the phase of the high-frequency signal M2 that propagates along the second slot line 4 is adjusted by changing the length L of the stub 6, to make the phase of the high-frequency signal M2 the same as the phase of the high-frequency signal M1 that propagates along the first slot line 3. Therefore, a phase difference does not occur. As a result, an undesired wave that occurs in the dielectric substrate 2 is suppressed, so that it is possible to prevent unnecessary coupling with a peripheral external device or electrical power loss caused by the generation of the undesired wave.

The inventors conducted the following simulation to confirm such advantages.

In the simulation, in the high-frequency circuit device 1 shown in FIG. 1, a substrate in which a dielectric material having a dielectric constant of 24 was formed into a rectangular shape having a length of 8.03 mm (in the lengthwise direction of the first slot line 3) and a width of 6.60 mm (in the widthwise direction of the first slot line 3) was used as the dielectric substrate 2. In addition, the interval of the first slot line 3 was set to 10 μm, and the interval of the second slot line 4 was set to 100 μm. A GS FET was used as the FET 5.

In this simulation, first, in the high-frequency circuit device 1, the length L of the stub 6 was set to 0 mm. That is, for the high-frequency circuit device not having the stub 6, a high-frequency signal having a frequency in the range of from 54 GHz to 66 GHz was propagated to calculate its gain.

Figure 5:
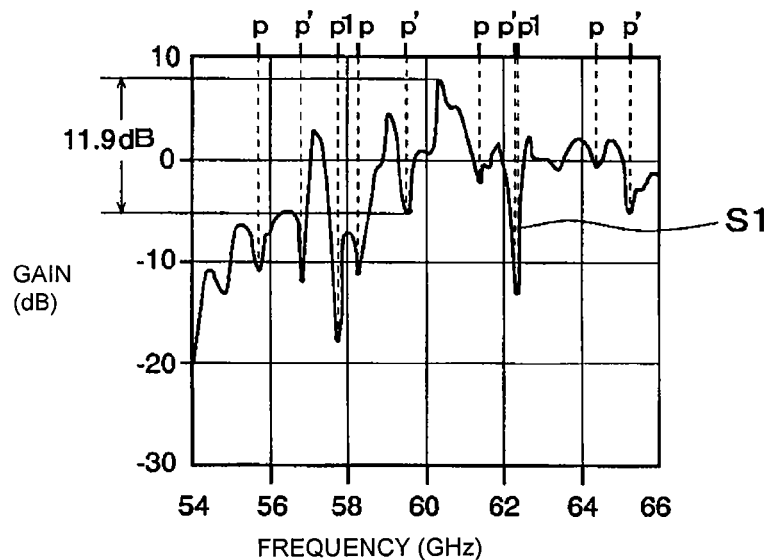
FIG. 5 is a diagram showing gain of the high-frequency circuit device not including a stub.

FIG. 5 is a diagram showing gain of the high-frequency circuit device not including the stub.

As shown by a gain curve S1 shown in FIG. 5, in the high-frequency circuit device not including the stub 6, periodic ripples, such as those shown at points p, p1, and p1, occurred in the range of from 54 GHz to 66 GHz. More specifically, periods between the points p-p and periods between the points p'-p' were approximately 3.7 GHz, and the wavelengths thereof corresponded to the length of the dielectric substrate 2. A period between the points p1-p1 was approximately 4.5 GHz, and the wavelength thereof corresponded to the width of the dielectric substrate 2. That is, it is inferred that a ripple such as that described above occurs due to resonation of an undesired wave, which is generated in the dielectric substrate 2, at the dielectric substrate 2. Ordinarily, in a millimeter-wave range, a high-frequency signal in the range of from 59 GHz to 61 GHz is used with 60 GHz as the central frequency. In the high-frequency circuit device not using the stub 6, as shown by the gain curve S1, the difference in gain in this range is 11.9 dB. Therefore, the operating characteristics are considerably poor.

Next, in the high-frequency circuit device 1, the length L of the stub 6 was set to a predetermined length, and a high-frequency signal having a frequency range of from 54 GHz to 66 GHz was propagated to calculate its gain.

Figure 6:
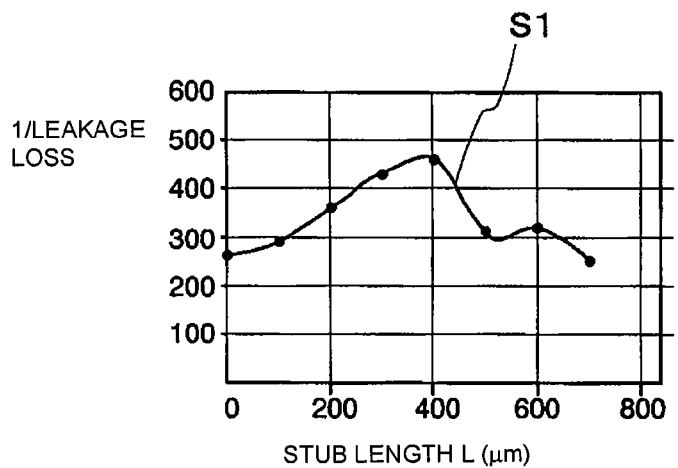
FIG. 6 is a diagram showing calculated values of an estimation of leakage loss with respect to stub length.

At this time, for the stub 6 having the length L in the range of from 0 μm to 800 μm, an estimation (Q reduced value) of leakage loss with respect to the length L of the stub 6 was calculated. FIG. 6 is a diagram showing calculated values of the estimation of leakage loss with respect to the length of the stub 6. A gain curve S1 corresponds to the calculated values of the high-frequency circuit device used in the simulation.

As shown by the curve S1 shown in FIG. 6, the length L of the stub 6 at which the calculated value was a maximum was 400 μm. Therefore, the length L of the stub 6 was set to 400 μm to calculate the gain of the high-frequency circuit device.

Figure 7:
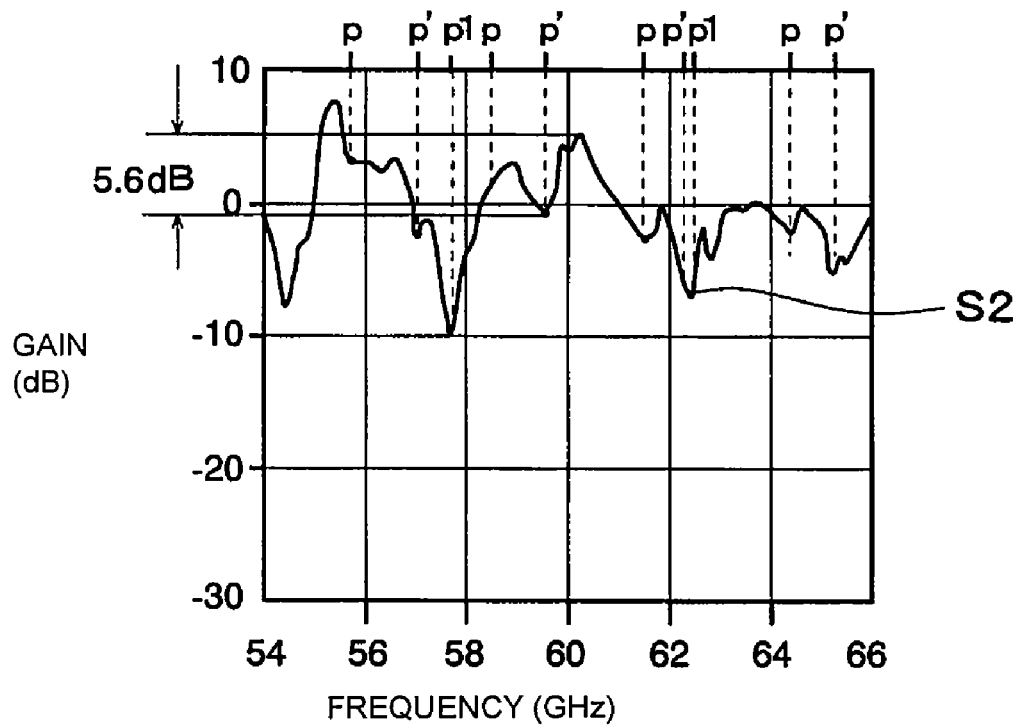
FIG. 7 is a diagram showing gain of the high-frequency circuit device including a stub having a length of 400 μm.

FIG. 7 is a diagram showing gain of the high-frequency circuit device including the stub having a length of 400 μm.

As shown by a gain curve S2 shown in FIG. 7, even in this simulation, as in the case in which a stub 6 was not provided, periodic ripples, such as those shown at points p, p', and p1, occurred in the range of from 54 GHz to 66 GHz. However, when a high-frequency signal in the range of from 59 GHz to 61 GHz was used, in the high-frequency circuit device including the stub 6, a gain difference in this range was compressed to 5.6 dB, so that an undesired wave was considerably suppressed.

Second Embodiment

Next, a second embodiment of the invention will be described.

Figure 8:
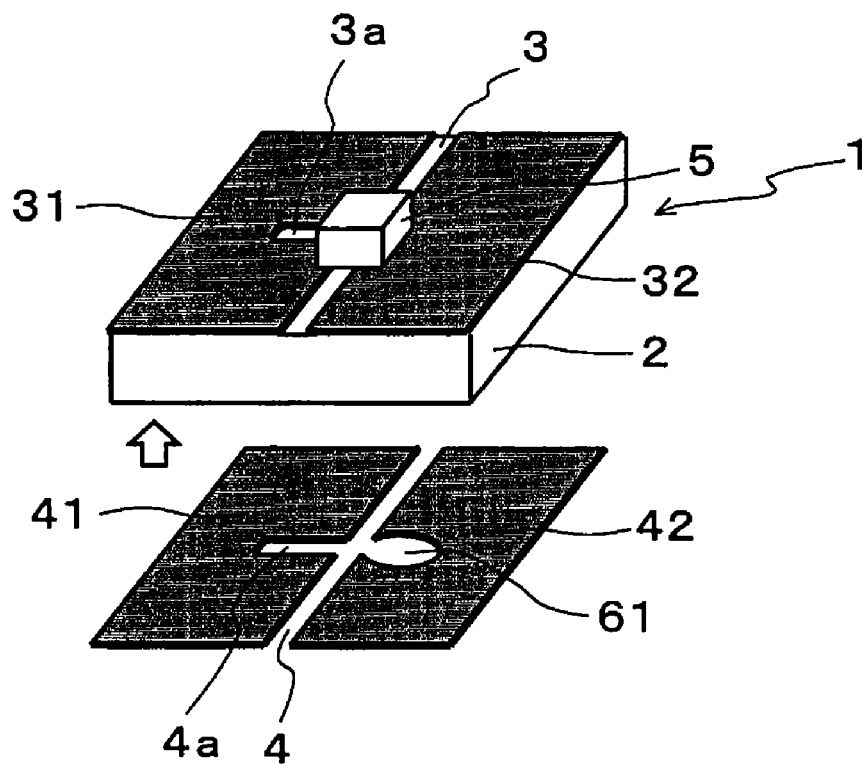
FIG. 8 is a partly exploded perspective view for illustrating a main portion of a high-frequency circuit device according to a second embodiment of the invention.

FIG. 8 is a partly exploded perspective view for illustrating a main portion of a high-frequency circuit device according to a second embodiment of the invention.

As shown in FIG. 8, in a high-frequency circuit device 1 according to this embodiment, the shape of a stub serving as a phase adjuster differs from the shape of the stub 6 in the first embodiment.

That is, a circular short stub 61 is formed at the position of a stub 4*a*. By adjusting the diameter of the short stub 61, the phase of a high-frequency signal M2 that propagates along a second slot line 4 is adjusted.

The other structural features, operations, and advantages are the same as those of the first embodiment, so that they will not be described below.

As a modification of this embodiment, it is possible to form an elliptical short stub at the position of the stub 4*a*. By adjusting the size of the long axis or the short axis of the short stub, the phase of the high-frequency signal M2 that propagates along the second slot line 4 is adjusted.

Third Embodiment

Next, a third embodiment of the invention will be described.

Figure 9:
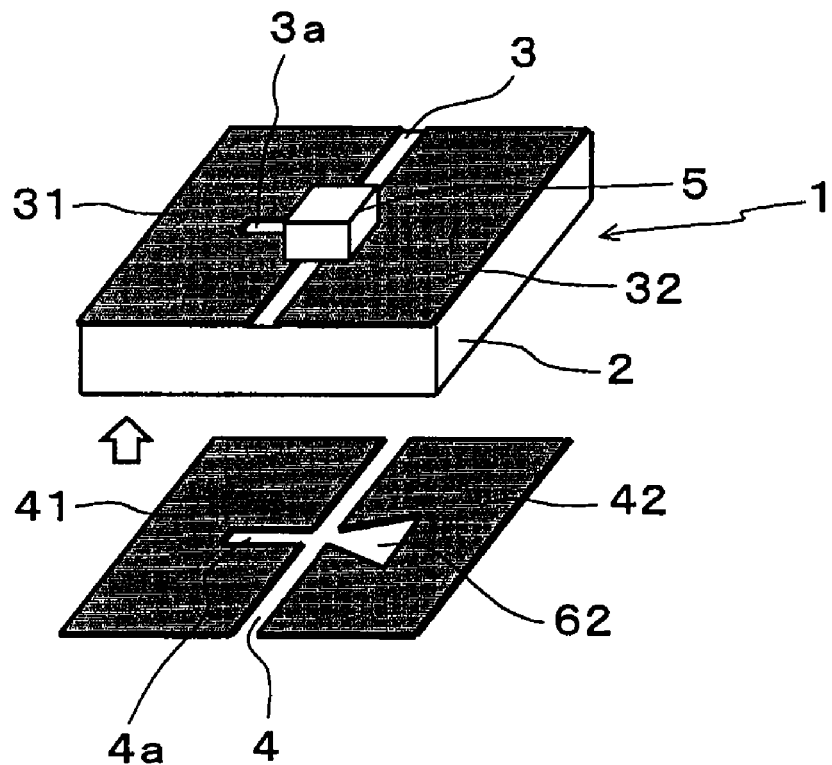
FIG. 9 is a partly exploded perspective view for illustrating a main portion of a high-frequency circuit device according to a third embodiment of the invention.

FIG. 9 is a partly exploded perspective view for illustrating a main portion of a high-frequency circuit device according to a third embodiment of the invention.

As shown in FIG. 9, in a high-frequency circuit device according to this embodiment, the shape of a stub serving as a phase adjuster differs from the shapes of the stubs 6 and 61 in the respective first and second embodiments.

That is, a tapering short stub 62 is formed at the position of a stub 4*a*. A portion of the short stub 62 where it is branched from a second slot line 4 is narrow, and the short stub becomes wider towards an end side thereof. By adjusting, for example, the angle at which the short stub widens or the length of protrusion of the short stub 62 from the second slot line 4, the phase of a high-frequency signal M2 that propagates along the second slot line 4 can be adjusted.

The other structural features, operations, and advantages are the same as those of the first and second embodiments, so that they will not be described below.

As a modification of this embodiment, a short stub having the shape of a fan may be formed at the position of the stub 4*a*.

Fourth Embodiment

Next, a fourth embodiment of the invention will be described.

Figure 10:
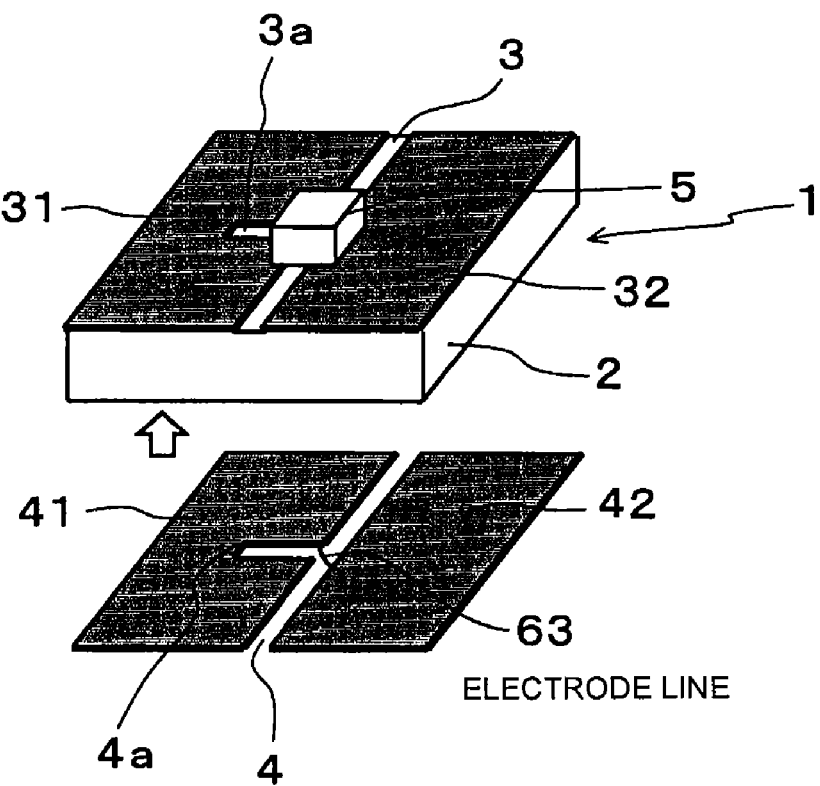
FIG. 10 is a partly exploded perspective view for illustrating a main portion of a high-frequency circuit device according to a fourth embodiment of the invention.
Figure 11:
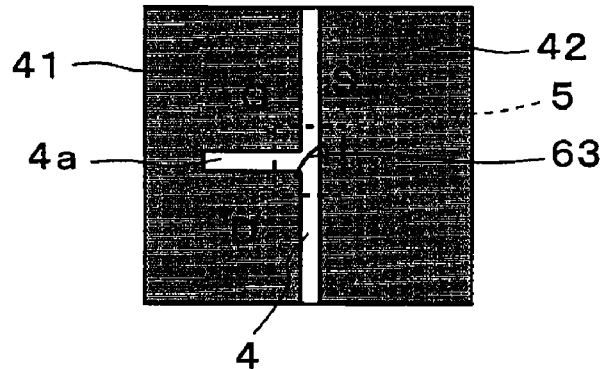
FIG. 11 is a plan view of a back surface side of the high-frequency circuit device according to this embodiment.

FIG. 10 is a partly exploded perspective view for illustrating a main portion of a high-frequency circuit device according to a fourth embodiment of the invention. FIG. 11 is a plan view of a back surface side of the high-frequency circuit device according to this embodiment.

As shown in FIGS. 10 and 11, a high-frequency circuit device 1 according to this embodiment differs from those according to the first to third embodiments in that an electrode line 63 is a phase adjuster.

That is, the electrode line 63 having a predetermined length connects electrodes 41 and 42 so as to be provided on both sides of a second slot line 4. More specifically, the electrode line 63 having the form of a bridge is provided at a location that is directly behind an FET 5 at the second slot line 4 and that is in correspondence with a drain electrode D and a source electrode S of the FET 5, so that this location is short-circuited.

By virtue of such a structure, adjusting the length of the electrode line 63 makes it possible to adjust the phase of a high-frequency signal M2 that propagates along the second slot line 4 to a phase that is substantially the same as the phase of a high-frequency signal M1 that propagates along a first slot line 3. As a result, it is possible to suppress generation of an undesired wave.

The inventors conducted a simulation that is substantially the same as that conducted for the first embodiment to confirm such advantages.

Figure 12:
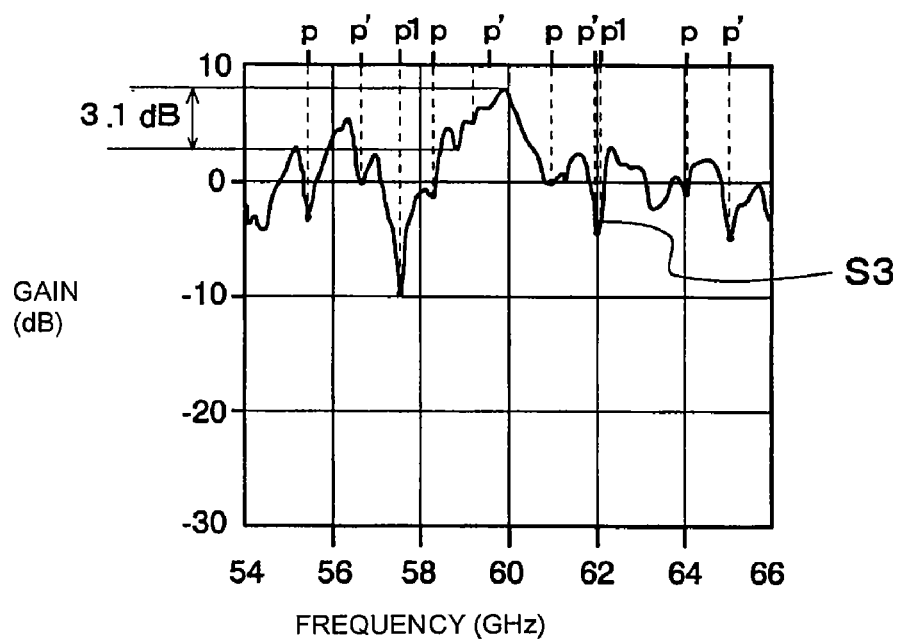
FIG. 12 is a diagram showing gain of the high-frequency circuit device including an electrode line.

FIG. 12 is a diagram showing gain of the high-frequency circuit device including the electrode line.

Even in this simulation, as shown by a gain curve S3 shown in FIG. 12, periodic ripples, such as those shown at points p, p', and p1, occurred in the range of from 54 GHz to 66 GHz. However, when a high-frequency signal in the range of from 59 GHz to 61 GHz was used, in the high-frequency circuit device including the electrode line 63, a gain difference in this range was compressed to 3.1 dB, so that, compared to the first embodiment, an undesired wave was considerably suppressed.

In the first to third embodiments, the stubs 6, 61, and 62 that required a relative large disposition space are used for adjusting the phase. However, in this embodiment, since the electrode line 63 that is provided on both sides of the second slot line 4 is used for adjusting the phase, it is possible to reduce the size of the high-frequency circuit device 1, itself. In addition, since the isolation at the side of the second slot line 4 is increased, it is possible to improve device characteristics and designability.

The other structural features, operations, and advantages are the same as those of the first to third embodiments, so that they will not be described below.

Fifth Embodiment

Next, a fifth embodiment of the invention will be described.

Figure 13:
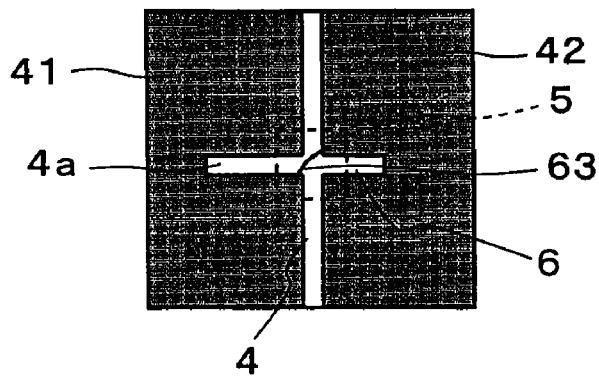
FIG. 13 is a plan view of a back surface side, which is a main portion of a high-frequency circuit device according to a fifth embodiment of the invention.
Figure 14:
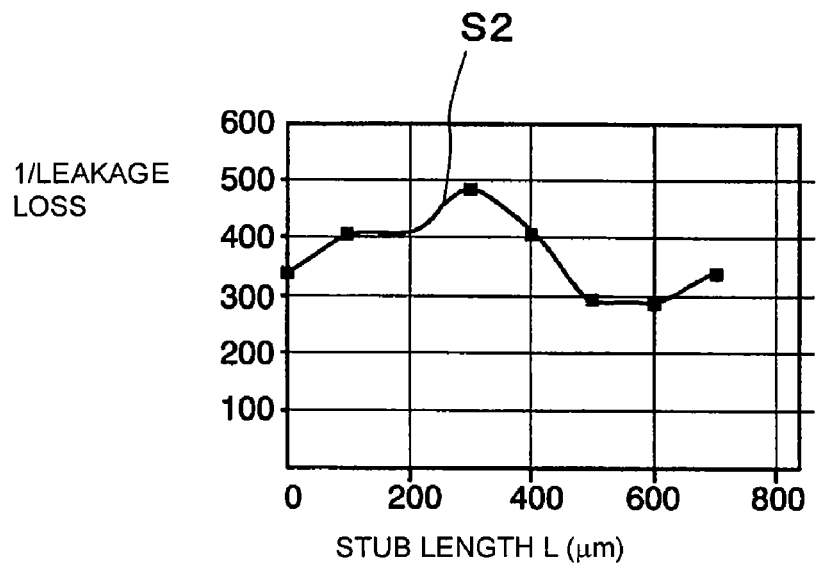
FIG. 14 is a diagram showing calculated values of an estimation of leakage loss with respect to stub length.

FIG. 13 is a plan view of a back surface side, which is a main portion of a high-frequency circuit device according to a fifth embodiment of the invention. FIG. 14 is a diagram showing calculated values of an estimation of leakage loss with respect to stub length. In FIG. 14, the vertical axis represents the reciprocal of insertion loss, and a curve S2 represents calculated values in the high-frequency circuit device according to this embodiment.

This embodiment differs from the fourth embodiment in that, in addition to an electrode line 63, a stub 6 is provided at a second slot line 4.

That is, as shown in FIG. 13, the electrode line 63 having a predetermined length connects electrodes 41 and 42 so as to be provided on respective sides of the second slot line 4, and the stub 6 is formed at the position of a stub 4a. More specifically, the high-frequency circuit device has a structure in which a location that is directly behind an FET 5 at the second slot line 4 and that is in correspondence with a drain electrode D and a source electrode S of the FET 5 is short-circuited by the electrode line 63, and in which a high-frequency signal M2 is reflected by the stub 6.

In such a structure, as shown by a curve S2 shown in FIG. 14, a length L of the stub 6 at which the calculated value of leakage loss is a minimum is approximately 300 μm.

The other structural features, operations, and advantages are the same as those of the fourth embodiment, so that they will not be described below.

As a modification of this embodiment, instead of the straight stub 6, a circular short stub, an elliptical short stub, a tapering short stub, or a stub having the shape of a fan may be used.

Sixth Embodiment

Next, a sixth embodiment of the invention will be described.

Figure 15:
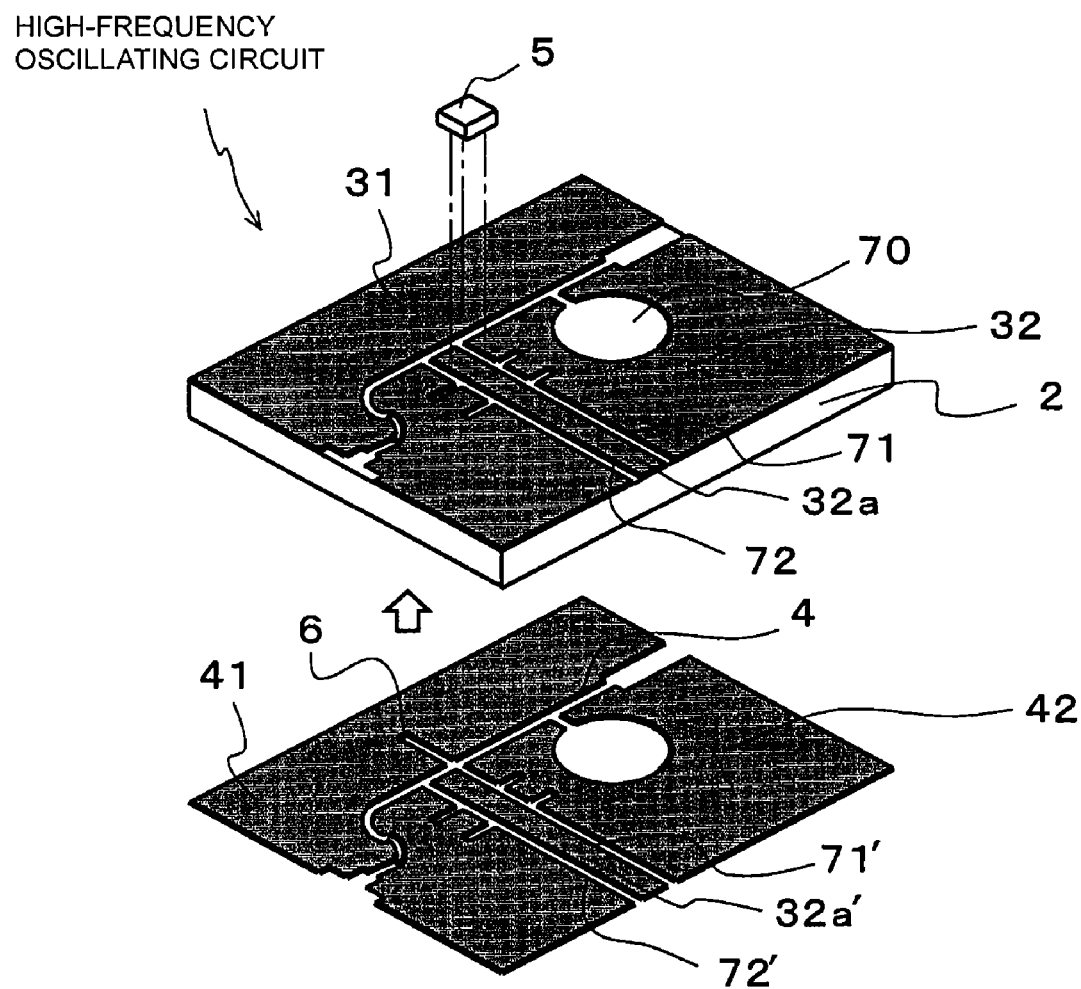
FIG. 15 is a partly exploded perspective view for illustrating a main portion of a high-frequency oscillating circuit according to a sixth embodiment of the invention.

FIG. 15 is a partly exploded perspective view for illustrating a main portion of a high-frequency oscillating circuit according to a sixth embodiment of the invention.

In the embodiment, a high-frequency circuit device is applied to the high-frequency oscillating circuit.

As shown in FIG. 15, a high-frequency oscillating circuit 7 is a circuit that transmits high-frequency signals, which are generated at a dielectric resonator 70 and which have predetermined resonance frequencies, along a first slot line 3 and a second line slot 4, and amplifies the signals to output the signals.

More specifically, DC cut lines 71 and 72 are formed in an electrode 32, provided at a front surface side of a dielectric substrate 2, to define a DC electrode 32a. In addition, a gate electrode G of an FET 5 is connected to the DC electrode 32a, a drain electrode D is connected to the electrode 32, positioned on the right of the DC cut line 71, and a source electrode S is connected to an electrode 31. DC cut lines 71' and 72' are also formed at a second slot line 4, provided at a back surface side of the dielectric substrate 2, and a straight stub 6 for adjusting a phase is provided at the position of the DC cut line 71' so as to project therefrom.

By virtue of such a structure, undesired wave, which is generated in the dielectric substrate 2 of the high-frequency oscillating circuit 7, is suppressed, so that operating characteristics of the high-frequency oscillating circuit can be improved, and variations in characteristics can be reduced. In addition, the designability of these circuits is improved.

The other structural features, operations, and advantages are the same as those of the first embodiment, so that they will not be described below.

Seventh Embodiment

Next, a seventh embodiment of the invention will be described.

Figure 16:
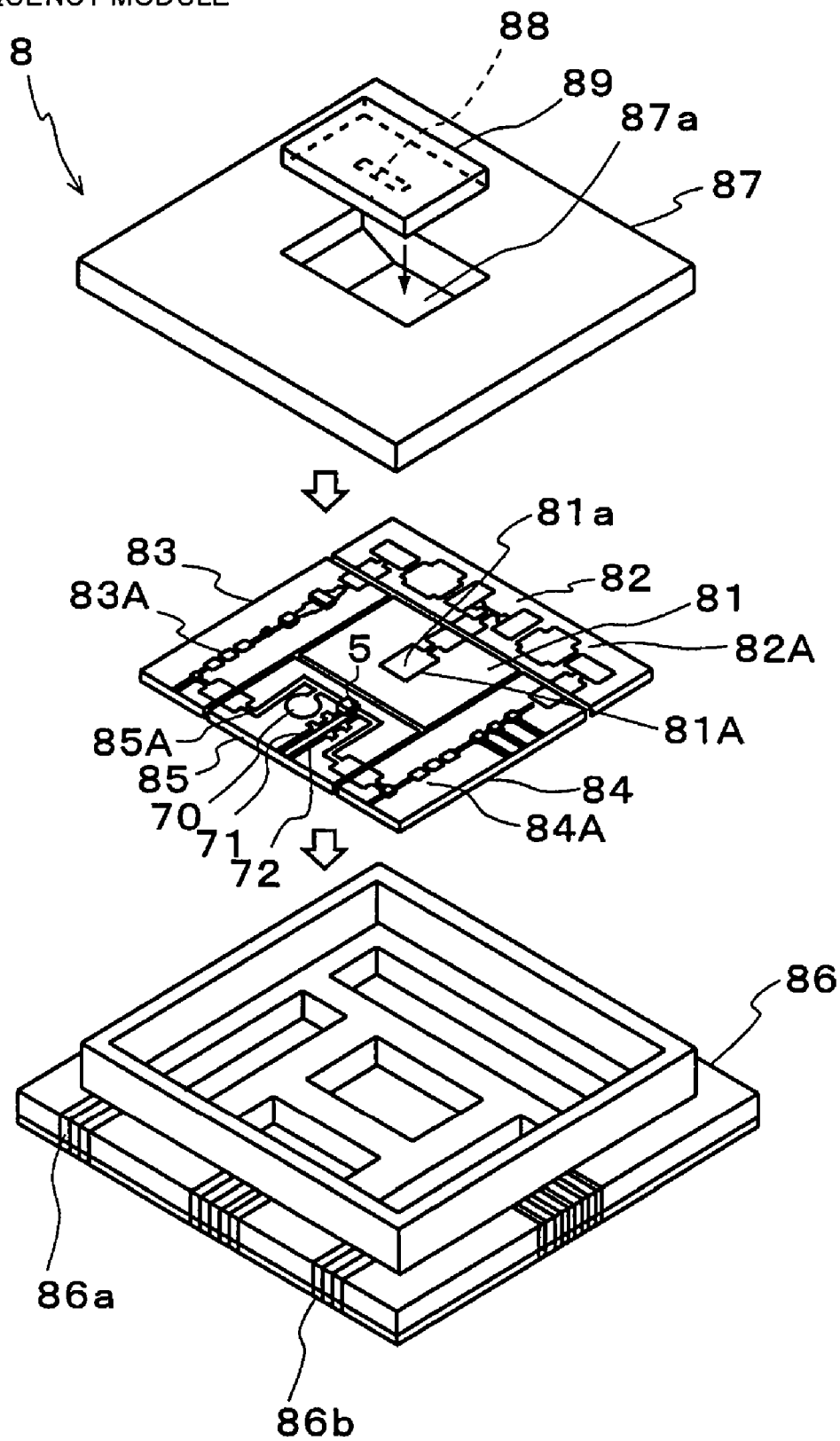
FIG. 16 is an exploded perspective view of a high-frequency module according to a seventh embodiment of the invention.
Figure 17:
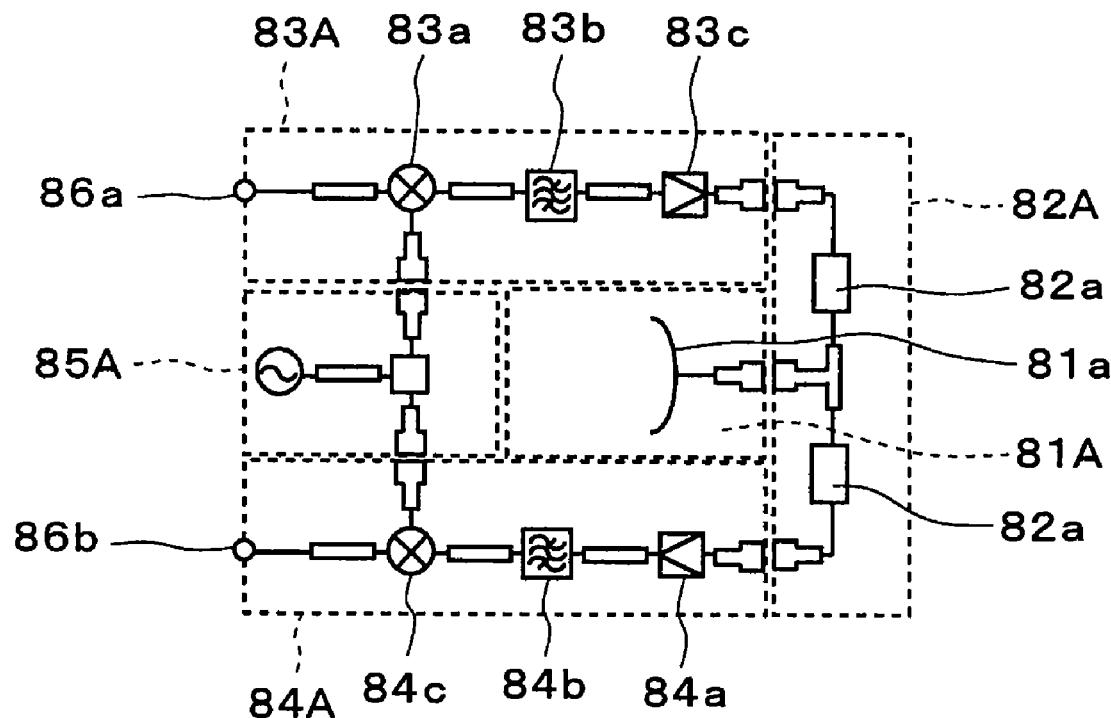
FIG. 17 is a block diagram of the high-frequency module.

FIG. 16 is an exploded perspective view of a high-frequency module according to a seventh embodiment of the invention. FIG. 17 is a block diagram of the high-frequency module.

As shown in FIG. 16, a high-frequency module 8 according to this embodiment comprises split substrates 81 to 85, which have respective circuits formed thereat, and a package 86, which accommodates these split substrates 81 to 85.

Each of the split substrates 81 to 85 is a circuit substrate having a PDTL structure. As a circuit block, an antenna circuit 81A, a common device circuit 82A, a transmitting circuit 83A, a receiving circuit 84A, and an oscillating circuit 85A are formed at the split substrates 81 to 85, respectively.

As shown in FIG. 17, the antenna circuit 81A, formed at the split substrate 81, is a block that transmits a transmission electric wave and receives a reception electric wave. The antenna circuit 81A is formed by a radiating slot 81a. The common device circuit 82A, formed at the split substrate 82, is a block that is connected to the antenna circuit 81A to form an antenna common device. The common device circuit 82A is formed by, for example, a resonator 82a. The transmitting circuit 83A, formed at the split substrate 83, is a block that is connected to the common device circuit 82A and that outputs a transmission signal towards the antenna circuit 81A. The transmitting circuit 83A comprises a mixer 83a, serving as a mixer circuit, a band-pass filter 83b, and an electrical power amplifier 83c, serving as a high-frequency amplifying circuit. The receiving circuit 84A, formed at the split substrate 84, is a block that is connected to the common device circuit 82A and that has a reception signal, received by the antenna circuit 81A, input thereto. The receiving circuit 84A comprises a low-noise amplifier 84a, serving as a high-frequency amplifying circuit, a band-pass filter 84b, and a mixer 84c, serving as a mixer circuit. The oscillating circuit 85A, formed at the split substrate 85, is a block that is connected to the transmitting circuit 83A and the receiving circuit 84A and that oscillates a signal, which has a predetermined frequency and which is a carrier wave. The oscillating circuit 85A has the same structure as the high-frequency oscillator according to the sixth embodiment.

In FIG. 16, the package 86 is a resin package, which is metalized with a conductive metallic material, and accommodates the split substrates 81 to 85 in its interior. A cover 87, mounted on the package 86, has an opening 87a at the central portion thereof. A blocking plate 89, which has a parasitic antenna 88 and which can transmit electromagnetic waves, is mounted in the opening 87a. By this, the parasitic antenna 88 faces the radiating slot 81a at the split substrate 81.

In FIGS. 16 and 17, reference numeral 86a denotes an input terminal for inputting an intermediate-frequency signal to the transmitting circuit 83A, and reference numeral 86b denotes an output terminal for outputting the intermediate-frequency signal from the receiving circuit 84A.

In the seventh embodiment, the high-frequency oscillating circuit according to the sixth embodiment is applied to the oscillating circuit 85A. That is, in addition to providing a phase-adjusting stub 6 at the back side of the split substrate 85 for the oscillating circuit 85A, it is desirable to provide phase-adjusting stubs 6 at the split substrate 83 for the transmitting circuit 83A, which comprises the mixer 83a and the electrical power amplifier 83a and which requires an FET to be provided thereat, and at the split substrate 84 for the receiving circuit 84A, which comprises the low-noise amplifier 84a and the mixer 84c and which requires an FET to be provided thereat, to match the phases of the high-frequency signals that propagate along these circuits.

The other structural features, operations, and advantages are the same as those of the sixth embodiment, so that they will not be described below.

Eighth Embodiment

Next, an eighth embodiment of the invention will be described.

Figure 18:
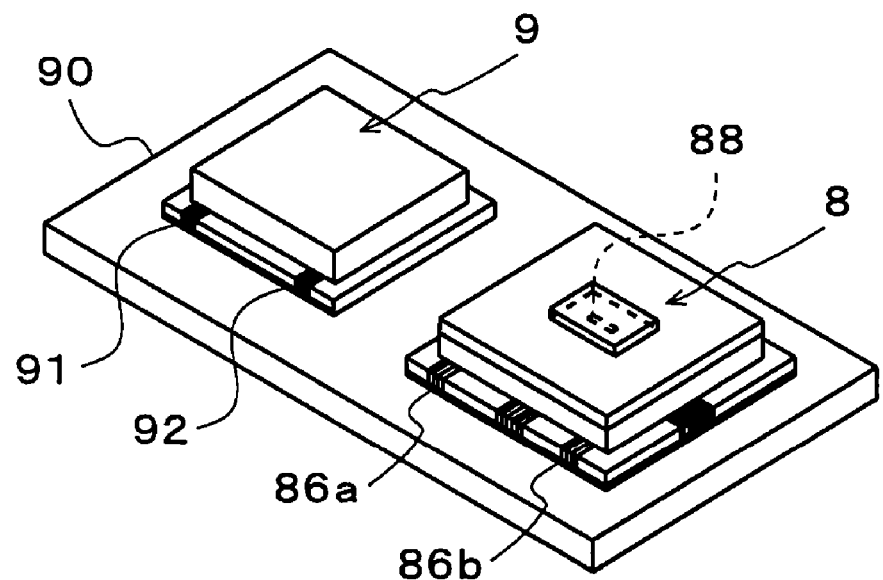
FIG. 18 is a perspective view of a main portion of a communication apparatus including the high-frequency module according to the seventh embodiment.
Figure 19:
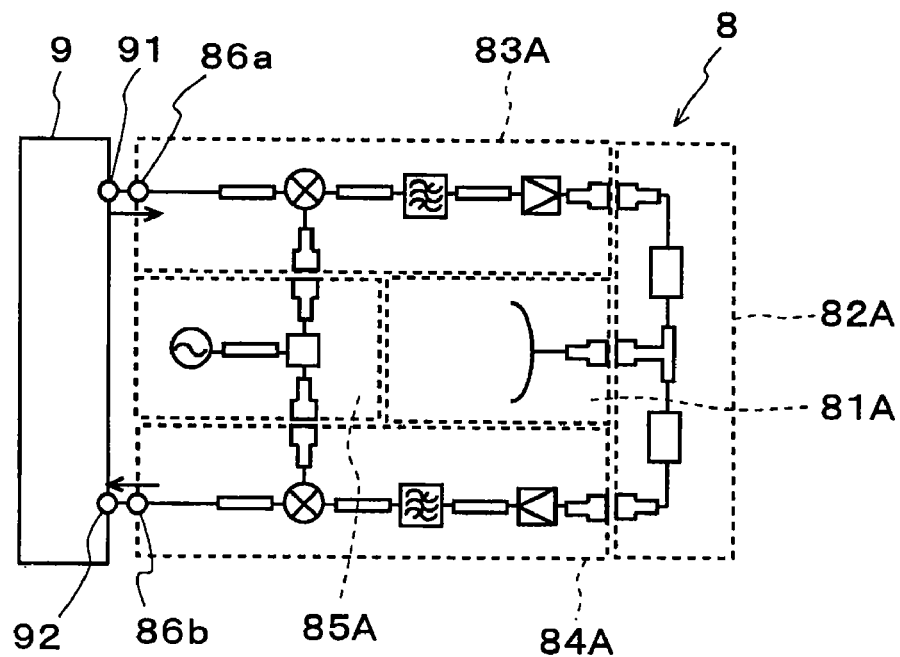
FIG. 19 is a block diagram of the communication apparatus.

FIG. 18 is a perspective view of a main portion of a communication apparatus including the high-frequency module according to the seventh embodiment. FIG. 19 is a block diagram of the communication apparatus.

In FIG. 18, reference numeral 90 denotes a substrate, and the high-frequency module 8 according to the seventh embodiment and a BB (base band) chip 9 are mounted to the substrate 90.

By virtue of such a structure, the BB chip 9 functions as a BB section, and an intermediate-frequency base band signal that has been modulated by the BB chip 9 is input to the high-frequency module 8 (functions as an RF section) through the input terminal 86a from an output terminal 91. Then, the intermediate-frequency base band signal is converted into a signal having a predetermined high frequency by the transmitting circuit 83A, and the converted signal is transmitted as an electric wave from the parasitic antenna 88. A reception signal that is received by the parasitic antenna 88 and that is converted into a signal having an intermediate frequency by the receiving circuit 84A is output to an input terminal 92 of the BB chip 9 from the output terminal 86b. This causes the reception signal to be demodulated into a predetermined base band signal at the BB chip 9.

Accordingly, using the high-frequency module 8 according to the aforementioned embodiment makes it possible to provide a communication apparatus that has highly reliable operating characteristics and that has little variations in characteristics. In addition, it is possible to improve the designability of the module and the communication apparatus.

The other structural features, operations, and advantages are the same as those of the seventh embodiment, so that they will not be described below.

Although, in the embodiment, a communication apparatus, such as a cellular phone, comprising the high-frequency module 8 and the BB chip 9 is used as an example, the invention may also be applied to a radar apparatus, which transmits and receives a high-frequency signal in a millimeter-wave zone, as a result of using a signal processor instead of the BB chip 9.

The invention is not limited to the above-described embodiments, so that various modifications and changes may be made within the scope of the gist of the invention.

Figure 20:
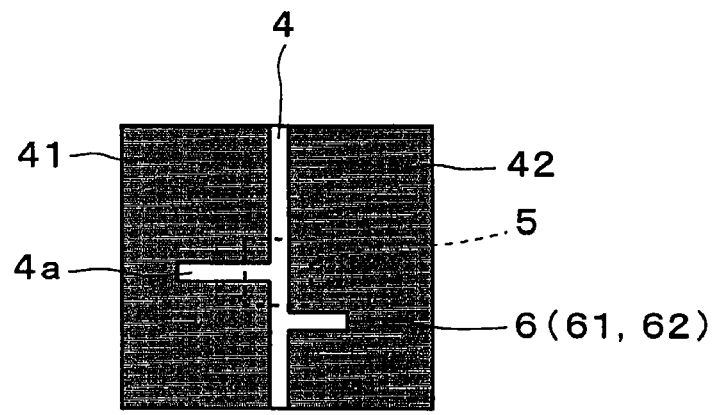
FIG. 20 is a plan view of a back surface side of a high-frequency circuit device according to one modification.
Figure 21:
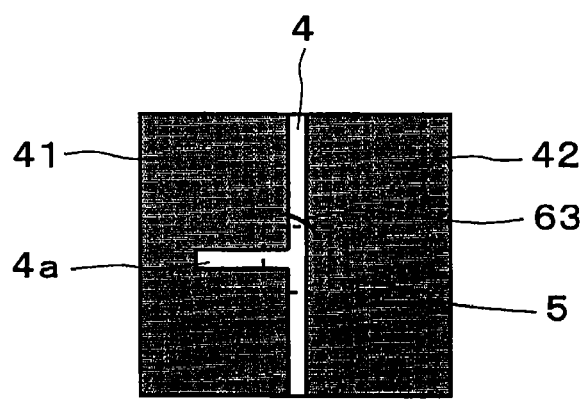
FIG. 21 is a plan view of a back surface side of a high-frequency circuit device according to another modification.
Figure 22:
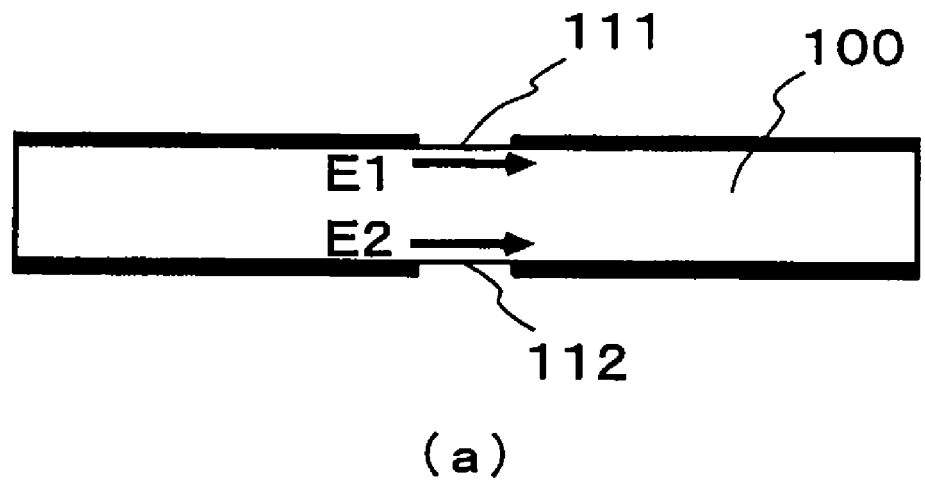
FIG. 22 is a schematic sectional view for illustrating problems of a related high-frequency circuit device.
Figure 22:
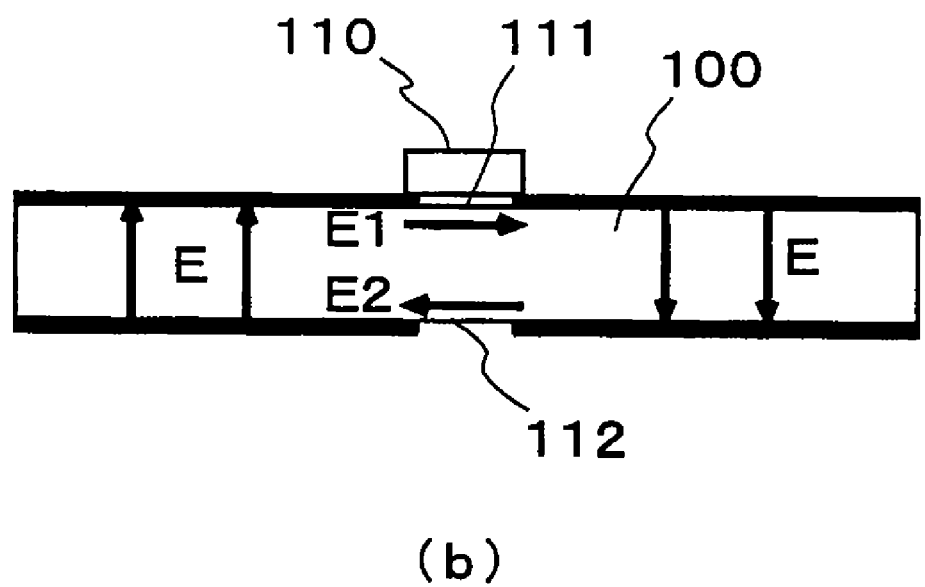

For example, although, in the first to third embodiments, the phase adjusting stubs 6, 61, and 62 are formed at the same locations as the isolator stubs 4a at the second slot lines 4, the stub 6 may be displaced from the stub 4a as shown in FIG. 20. Similarly, although, in the fourth and fifth embodiments, the phase-adjusting electrode lines 63 are formed at the same locations as the isolator stubs 4a at the second slot lines 4, the electrode lines 63 may obviously be displaced from the respective stubs 4a as shown in FIG. 21.

In addition, although, in each of the embodiments, the interval W1 of the first slot line 3 and the interval W2 of the second slot line 4 are equal to each other, the width of the first slot line 3 may be greater than or less than the width of the second slot line 4, or the line width of the first slot line 3 and the line width of the second slot line 4 may differ from each other.

Further, although, in the sixth embodiment, the high-frequency circuit device is applied to a high-frequency oscillating circuit, the high-frequency circuit device according to the invention may obviously be applied to a mixer circuit or a high-frequency amplifying circuit applied to the high-frequency module according to the seventh embodiment.

The invention claimed is:

1. A high-frequency circuit device comprising:
   a substrate having opposing first and second surfaces;
   a first set of facing electrodes disposed on the first surface of the substrate, the first set of facing electrodes forming a first slot line therebetween;
   a second set of facing electrodes disposed on the second surface of the substrate, the second set of facing electrodes forming a second slot line therebetween, the second slot line opposing the first slot line;
   an electrical element provided on the first slot line; and
   a phase adjuster provided at the second slot line, the phase adjuster adjusting a phase of a second high-frequency signal that propagates along the second slot line to be substantially the same as a phase of a first high-frequency signal that propagates along the first slot line.

2. The high-frequency circuit device according to claim 1, wherein the phase adjuster is an electrode line connecting the second facing electrodes and positioned on both sides of the second slot line.

3. The high-frequency circuit device according to claim 1, wherein the phase adjuster includes:
   a stub that is branched from the second slot line; and
   an electrode line connecting the second facing electrodes and positioned on both sides of the second slot line.

4. The high-frequency circuit device according to claim 1, wherein the phase adjuster is situated substantially directly opposing the electrical element.

5. A high-frequency module comprising:
   the high-frequency circuit device according to claim 1.

6. A communication apparatus comprising: the high-frequency module according to claim 5.

7. A radar apparatus comprising: the communication apparatus according to claim 6.

8. The high-frequency circuit device according to claim 1, wherein the phase adjuster is a stub that is branched from the second slot line.

9. The high-frequency circuit device according to claim 8, wherein the stub is a straight stub having a predetermined length.

10. The high-frequency circuit device according to claim 8, wherein the stub is a circular stub.

11. The high-frequency circuit device according to claim 8, wherein the stub is a tapering stub.

* * * * *